(12) United States Patent
Gattere et al.

(10) Patent No.: US 10,775,171 B2
(45) Date of Patent: Sep. 15, 2020

(54) MEMS GYROSCOPE WITH IMPROVED REJECTION OF A QUADRATURE ERROR

(71) Applicant: STMicroelectronics S.r.l., Agrate Brianza (IT)

(72) Inventors: Gabriele Gattere, Castronno (IT); Luca Guerinoni, Alzano Lombardo (IT); Luca Giuseppe Falorni, Limbiate (IT); Damiano Milani, Fontanella (IT); Francesco Braghin, Varese (IT); Ferruccio Resta, Milan (IT); Mohammad Izadi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 217 days.

(21) Appl. No.: 15/956,446

(22) Filed: Apr. 18, 2018

(65) Prior Publication Data
US 2018/0306580 A1 Oct. 25, 2018

(30) Foreign Application Priority Data
Apr. 19, 2017 (IT) .................. 102017000043012

(51) Int. Cl.
*G01C 19/5712* (2012.01)
*G01C 19/574* (2012.01)
*G01C 19/5755* (2012.01)

(52) U.S. Cl.
CPC ....... *G01C 19/5712* (2013.01); *G01C 19/574* (2013.01); *G01C 19/5755* (2013.01); *B81B 2201/0242* (2013.01)

(58) Field of Classification Search
CPC ............. G01C 19/5712; G01C 19/574; G01C 19/5755; G01C 19/5747; G01C 19/5719
See application file for complete search history.

(56) References Cited

U.S. PATENT DOCUMENTS 6,230,563 B1 * 5/2001 Clark ................. G01C 19/5719
73/504.04
8,453,504 B1 * 6/2013 Mao ..................... G01C 19/574
73/504.14

(Continued)

OTHER PUBLICATIONS

Acar, "High-Performance 6-Axis MEMS Inertial Sensor Based on Through-Silicon Via Technology," 2016 IEEE International Symposium on Inertial Sensors and Systems, Feb. 22-25, 2016, Laguna Beach, CA, 4 pages.

(Continued)

*Primary Examiner* — Helen C Kwok
(74) *Attorney, Agent, or Firm* — Seed Intellectual Property Law Group LLP

(57) ABSTRACT

A MEMS gyroscope is equipped with: at least a first mobile mass suspended from the top of a substrate by means of elastic suspension elements coupled to anchor points rigidly fixed to the substrate, in such a manner as to be actuated in an actuating movement along a first axis of a horizontal plane and to carry out a measurement movement along a vertical axis, transverse to the horizontal plane, in response to a first angular velocity acting about a second axis of the horizontal plane, transverse to the first axis. The elastic suspension elements are configured in such a manner as to internally compensate unwanted displacements out of the horizontal plane along the vertical axis originating from the actuating movement, such that the mobile mass remains in the horizontal plane during the actuating movement.

20 Claims, 7 Drawing Sheets

(56) References Cited

U.S. PATENT DOCUMENTS

| | | | |
|---|---|---|---|
| 2002/0093067 A1* | 7/2002 | Knowles | B81B 3/0051 |
| | | | 257/419 |
| 2009/0165553 A1 | 7/2009 | Klemetti et al. | |
| 2009/0223277 A1 | 9/2009 | Rudolf et al. | |
| 2010/0186507 A1 | 7/2010 | Günthner et al. | |
| 2010/0236327 A1* | 9/2010 | Mao | G01C 19/5719 |
| | | | 73/504.12 |
| 2011/0185813 A1* | 8/2011 | Classen | G01C 19/5747 |
| | | | 73/504.13 |
| 2012/0096943 A1 | 4/2012 | Potasek et al. | |
| 2013/0139592 A1* | 6/2013 | Acar | G01C 19/5712 |
| | | | 73/504.12 |
| 2014/0144232 A1* | 5/2014 | Lin | B81B 3/0051 |
| | | | 73/504.12 |
| 2015/0316378 A1* | 11/2015 | Kergueris | G01C 19/5747 |
| | | | 73/504.12 |
| 2015/0377624 A1* | 12/2015 | Falorni | G01C 19/5712 |
| | | | 73/504.12 |
| 2016/0138666 A1* | 5/2016 | Hoeppner | G01C 19/56 |
| | | | 267/182 |
| 2018/0172447 A1* | 6/2018 | Prikhodko | G01C 19/5747 |
| 2019/0310087 A1* | 10/2019 | Gregory | G01C 19/5712 |

OTHER PUBLICATIONS

Tatar et al., "Quadrature-Error Compensation and Corresponding Effects on the Performance of Fully Decoupled MEMS Gyroscopes," *Journal of Microelectromechanical Systems* 21(3):656-667, Jun. 2012.

* cited by examiner

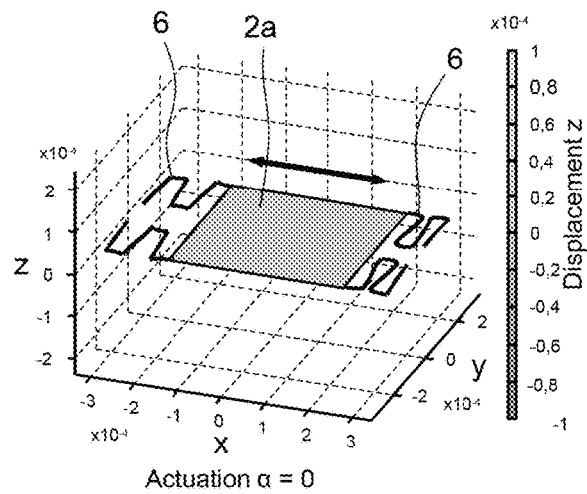
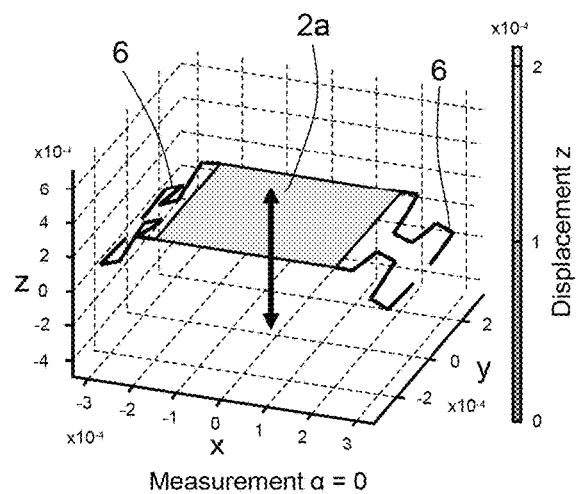
Fig.3A
(Background Art)
Fig.3B
(Background Art)
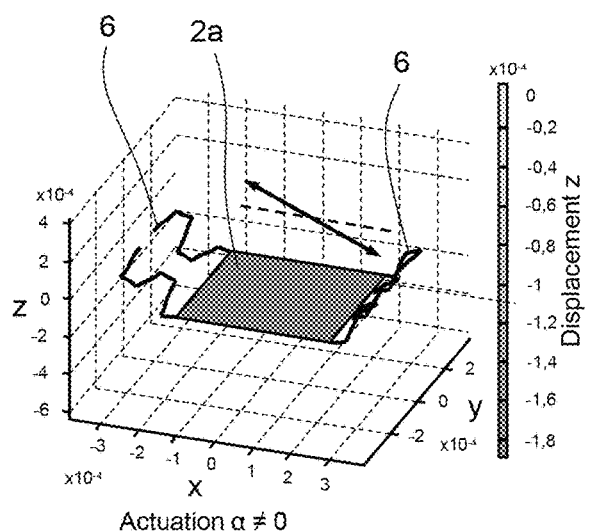
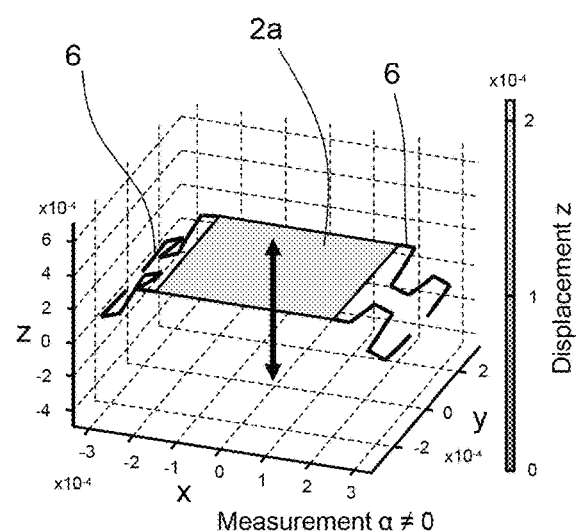
Fig.4A
(Background Art)
Fig.4B
(Background Art)

MEMS GYROSCOPE WITH IMPROVED REJECTION OF A QUADRATURE ERROR

BACKGROUND

Technical Field

The present disclosure relates to a MEMS gyroscope with improved rejection of a quadrature error, in particular relating to the out of plane measurement axes (referred to as "pitch" and "roll" axes).

Description of the Related Art

As is known, the current microfabrication techniques allow microelectromechanical systems (known as MEMS, i.e., Micro Electro Mechanical System) to be fabricated based on layers of semiconductor material, which have been deposited (for example a layer of polycrystalline silicon) or grown (for example an epitaxial layer) on top of sacrificial layers, which are removed by means of chemical etching. Inertial sensors, accelerometers and gyroscopes fabricated with such a technology are experiencing a growing success, for example in the automotive field, in inertial navigation, or in the sector of portable devices.

In particular, integrated semiconductor gyroscopes are known that are fabricated with MEMS technology (in the following simply referred to as MEMS gyroscopes).

Such MEMS gyroscopes operate according to the theorem of relative acceleration, based on the Coriolis acceleration.

When a rotation with a certain angular velocity (whose value is to be measured) is applied to a mobile mass which is travelling with a linear velocity, the mobile mass experiences an apparent force, known as Coriolis force, which causes its displacement in a direction perpendicular to the direction of the linear velocity of travel and to the axis about which the rotation occurs. The mobile mass is supported by means of elastic elements which allow its displacement in the direction of the apparent force. Based on Hooke's law, the displacement is proportional to the apparent force, in such a manner that, from the displacement of the mobile mass, it is possible to measure the Coriolis force and the value of the angular velocity of the rotation that has generated it.

The displacement of the mobile mass may for example be measured in a capacitive manner, determining, in a resonance condition, the variations in capacitance caused by the movement of mobile measurement electrodes rigidly attached to the mobile mass and coupled (for example in a parallel-plate configuration, or else in an interdigitated configuration) to the fixed measurement electrodes.

FIG. 1 shows schematically a basic measurement structure of a MEMS gyroscope 1, of the uniaxial type, in other words capable of an angular velocity, for example a roll, acting along a single measurement axis.

The MEMS gyroscope 1 comprises a mobile mass 2a with a main extension disposed, when at rest (in other words, in the absence of external stimuli), in a horizontal xy plane, formed by a first and by a second horizontal axis x, y, orthogonal to each another, and with a negligible (or at least very small) extension along a vertical axis z which, with the aforementioned horizontal axes x, y, forms a triad of orthogonal axes.

The mobile mass 2a is coupled to anchor points 4, rigidly fixed to a substrate 5 (of which only a portion is shown schematically by way of example), by means of elastic elements 6, so as to be suspended from the top of this substrate 5. The anchor points 4 may for example be composed of vertical columns which extend as far as the aforementioned substrate 5, and the elastic elements 6 are, in the example, of the type referred to as 'folded.'

In particular, the mobile mass 2a has a substantially rectangular form in a cross-section parallel to the horizontal xy plane, and the elastic elements 6, equal to four in number, extend from the corners or apices of the mobile mass 2a to respective anchor points 4.

In the example, the mobile mass 2a is actuated by means of an actuating movement along the first horizontal axis x, by means of a group of interdigitated actuating electrodes (not shown), comprising first electrodes, coupled to this mobile mass 2a, and second electrodes, interdigitated with the aforementioned first electrodes and rigidly fixed to the substrate 5 (FIG. 1).

In the presence of an angular velocity, for example a roll, $\Omega_y$ acting about the second horizontal axis y, a Coriolis force $F_{cor}$ is generated acting on the mobile mass 2a, along the vertical axis z, which causes its displacement along this vertical axis z, out of the horizontal xy plane. In a known manner, the aforementioned Coriolis force $F_{cor}$ is proportional to the derivative of the applied displacement (in other words, proportional to the applied velocity).

This displacement $\Omega_y$, which is a function of the value of the roll angular velocity, may for example be measured by means of the capacitive coupling of this mobile mass 2a with one or more measurement electrodes, disposed on the substrate 5 underneath this mobile mass 5 (in a manner not shown here).

The elastic elements 6 are therefore configured to allow both the applied movement of the mobile mass 5, in the example along the first horizontal axis x, and the measurement movement of this mobile mass 5, in the example along the vertical axis z, out of the horizontal xy plane.

In a known manner, the error known as quadrature error, in other words the coupling between the actuating movement (or mode) and the measurement mode or modes represents one of the major sources of the degradation in the performance of a MEMS gyroscope.

The reduction of the quadrature error is desirable in order to improve the signal-to-noise ratio (or SNR), the stability relative to external interference factors, such as bending, welding, thermal swelling or deformations, and in general in order to improve the performance of the MEMS gyroscope.

The quadrature error may be due to the design of the elastic elements 6, and to the direct coupling between the mechanical stiffness within the horizontal xy plane and the stiffness out of the horizontal xy plane.

In particular, with regard to the out of plane measurement, the main contribution to the quadrature error is represented by the "wall angle", which represents a distortion of the transverse cross-section of the elastic elements 6 and causes them a consequential "skew bending" out of the horizontal xy plane, in the presence of the actuating movement.

FIGS. 2A and 2B respectively show a portion 6' of an elastic element 6 with a main linear extension along the second horizontal axis y and the relevant transverse cross-section in the xz plane. The aforementioned wall angle is indicated with α in FIG. 2B and consists, in this case, of the angle formed between the vertical axis z and the inclined sidewall of the aforementioned transverse cross-section, having a width w and a height (or thickness) t.

The wall angle represents a distortion in the transverse cross-section, which has the consequential effect of a skew bending out of the horizontal xy plane of the elastic element 6 in the presence of a bending force $F_x$, in the example acting along the first horizontal axis x due to the actuating movement of the mobile mass 2a.

It may be demonstrated that the wall angle α generates a dynamic coupling between the actuating movement along the first axis x and the measurement movement along the vertical axis z, given by the generation of a mixed moment of inertia $I_{xz}$ relating to the transverse cross-section of the elastic element, expressed by the equation:

$$I_{xz} = \int\int_A xz\,dx\,dz = \frac{t^3 w \tan\alpha}{12}$$

where A indicates the area of the aforementioned transverse cross-section.

As shown in FIG. 2A, the resulting skew bending causes a displacement of the elastic element 6 out of the horizontal xy plane, along the vertical axis z, whose size is proportional to the actuating displacement and is also proportional to the value of tan α. This unwanted movement is therefore in quadrature, in other words at 90 degrees relative to the measurement movement, and is superposed with this phase shift onto this measurement movement due to the angular velocity, constituting a significant deterioration of the signal-to-noise ratio.

This phenomenon is illustrated in FIGS. 3A-3B, which show the actuating and measurement movement of the mobile mass 2a, in the presence of an ideal structure (i.e., free of quadrature error), and in FIGS. 4A-4B, which show the same actuating and measurement movements in the presence of the quadrature error.

In particular, in FIG. 4A, during the actuating movement, rather than remaining in the horizontal xy plane (as in the ideal case), the mobile mass 2a is displaced out of this horizontal xy plane by the effect of the wall angle. This movement is completely comparable with the measurement movement of this mobile mass 2a, making it difficult for it to be distinguished from the measurement movement itself.

Various solutions have been provided for eliminating, or at least reducing, the effect of the quadrature error.

In particular, known solutions provide an electronic compensation for the quadrature error, by means of an appropriate compensation stage in an electronic interface circuit, known as an ASIC (Application Specific Integrated Circuit), of the MEMS gyroscope.

A signal proportional to the quadrature value (generated as a function of the actuator signal) is injected into the measurement read chain with the aim of compensating for the charge relating to the displacement due to the quadrature error.

One drawback of such a solution is represented by the fact that the displacement due to the quadrature error is still present in the microelectromechanical measurement structure, with the associated problems arising from this, for example in terms of the displacement of the zero level, known as ZRL (for Zero Rate Level), in the presence of external stimuli which intervene in the modification of the quadrature signal present in the structure, in modulus and phase.

Another known solution provides a mechanical compensation for the quadrature error.

In the measurement structure of the MEMS gyroscope, for this purpose, dedicated compensation electrodes are provided, referred to as quadrature electrodes, in order to eliminate the spurious signal deriving from the quadrature error.

This solution is also however not completely satisfactory, in particular as regards the increase in the occupation of surface area and in the complexity of the measurement structure of the MEMS gyroscope.

A further solution which has been proposed provides instead an action on the chemical etching profiles which lead to the formation of the elastic elements of the measurement structure of the MEMS gyroscope, in order to eliminate, or at least reduce, the value of the wall angle.

Again, this solution does not however prove to be easy to implement and, in any case, is not completely satisfactory for the purposes of improving the performance of the MEMS gyroscope.

BRIEF SUMMARY

The aim of the present disclosure is to solve the aforementioned problems, and in particular to provide an improved solution for the elimination of the effects of the quadrature error in a MEMS gyroscope.

BRIEF DESCRIPTION OF THE SEVERAL VIEWS OF THE DRAWINGS

For a better understanding of the present disclosure, some of its preferred embodiments are now described, purely by way of non-limiting example and with reference to the appended drawings, in which:

FIGS. 3A-3B and 4A-4B show the measurement structure in FIG. 1 in an actuating movement and in a measurement movement, respectively, in the absence or in the presence of a quadrature error;

DETAILED DESCRIPTION

Figure 1:
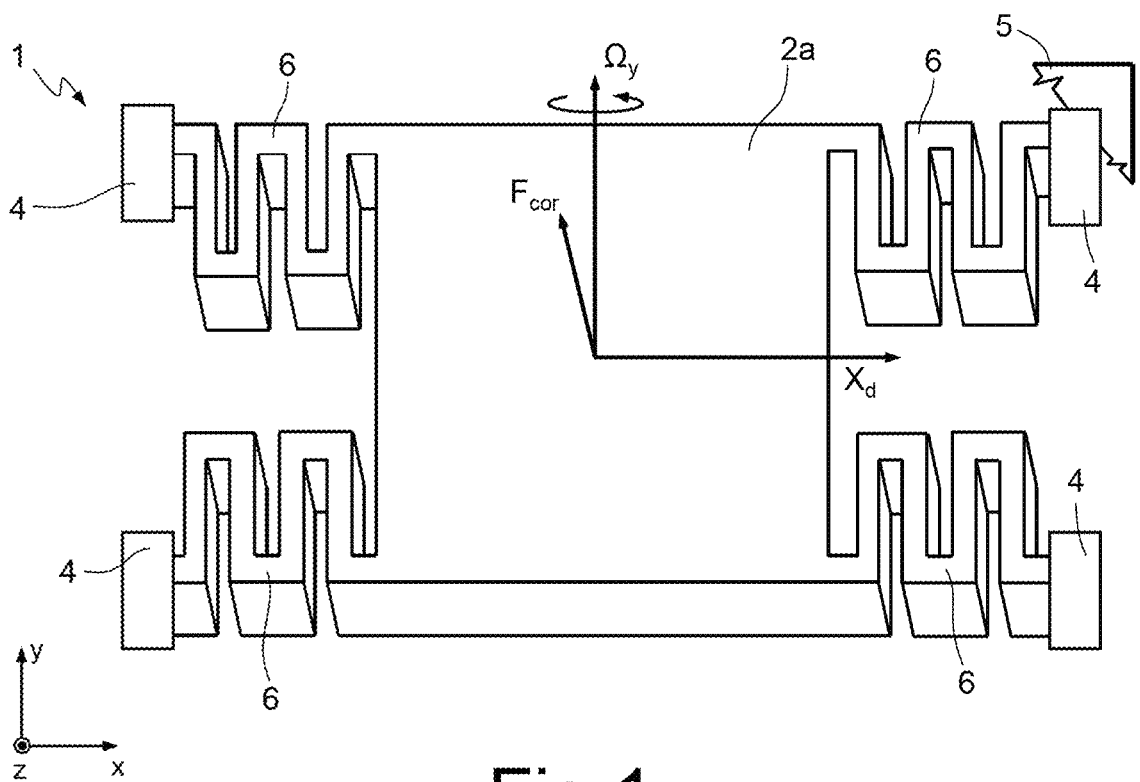
FIG. 1 shows a top view, schematic and simplified, of a microelectromechanical measurement structure of a MEMS gyroscope of a known type.
Figure 2A:
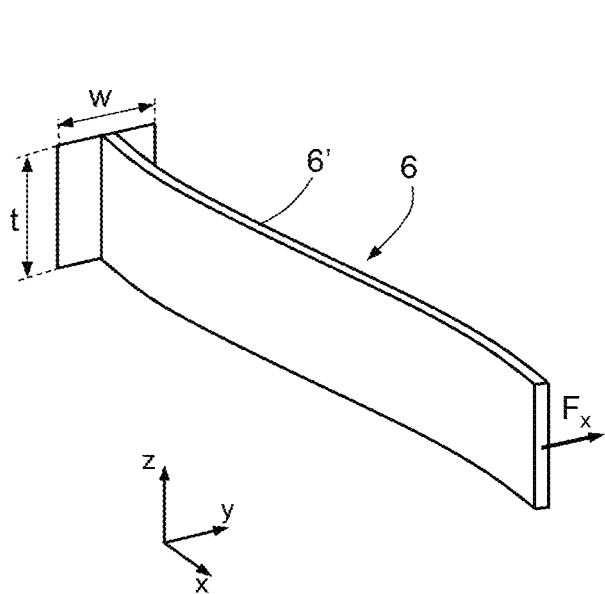
FIGS. 2A and 2B show, as an enlargement, a portion of an elastic element of the measurement structure in FIG. 1 and a related transverse cross-section.
Figure 2B:
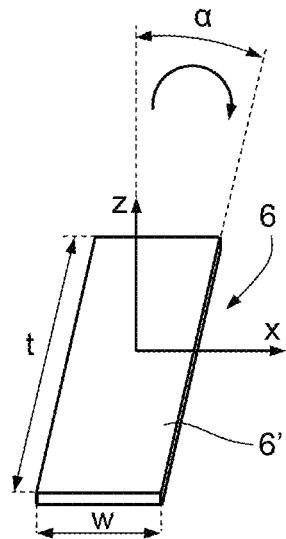

As will now be discussed with reference to FIG. 5, one aspect of the present solution provides a suitable implementation of the elastic suspension elements which couple the mobile mass to the anchor points in the measurement structure of the MEMS gyroscope so as to internally compensate the out of plane displacements due to the wall angle.

FIG. 5 again makes reference, in a schematic manner, to a basic measurement structure of a MEMS gyroscope, here indicated with 10, of the uniaxial type, in other words designed to measure an angular velocity, for example a roll, acting along a single measurement axis.

This measurement structure is similar to that described with reference to FIG. 1, for which elements similar to others already previously described are indicated with the same reference numbers and here are not described again.

The measurement structure therefore comprises the mobile mass 2a, which exhibits for example an actuating movement along the first horizontal axis x and, additionally, a measurement movement along the vertical axis z, out of the horizontal xy plane, in the presence of an angular velocity $\Omega_y$ acting about the second horizontal axis y.

This measurement structure however differs as compared with the known solution owing to a different configuration of the elastic elements for suspension of the mobile mass 2a on top of the substrate 5.

In particular, the mobile mass 2a is coupled to the anchor points 4, rigidly fixed to the substrate 5, by means of suspension elements 12, which are appropriately configured for compensating the distortion effects due to the wall angle.

In detail, each suspension element 12 comprises a first and a second elastic element 14a, 14b, in particular of the linear (or "beam") type and having a main extension along the actuation direction (in the example, along the first horizontal axis x), and furthermore a rigid body 15, coupled to these elastic elements 14a, 14b.

In particular, the first elastic element 14a has a first end connected to a respective corner or apex of the mobile mass 2a, and a second end connected to a distal portion of the rigid body 15 with respect to this mobile mass 2a (in the example, corresponding to a first apex of this rigid body 15 placed at the greatest distance from the mobile mass 2a along the first horizontal axis x). The second elastic element 14b has a respective first end connected to a respective anchor point 4, and a respective second end connected to a proximal portion of the rigid body 15 with respect to the mobile mass 2a (in the example, corresponding to a second corner or apex of this rigid body 15 placed at the shortest distance from this mobile mass 2a along the first horizontal axis x). The first and the second apex of the rigid body 15 are opposing along a diagonal of this rigid body 15, within a cross-section parallel to the horizontal xy plane.

The first and the second elastic element 14a, 14b are therefore parallel to each other and placed at a separation distance D along the second horizontal axis y. The rigid body 15 is interposed, in a central position, between these elastic elements 14a, 14b along this second horizontal axis y. In the embodiment illustrated in the same FIG. 5, the first and the second elastic element 14a, 14b furthermore have the same length L along the first horizontal axis x.

In the example illustrated, the second end of the first and of the second elastic element 14a, 14b is connected to the rigid body 15 by means of a respective connection element (indicated with 16a, 16b in the aforementioned FIG. 5, and henceforth no longer indicated) having a linear extension along the second horizontal axis y which is very small with respect to the aforementioned length L.

Figure 5:
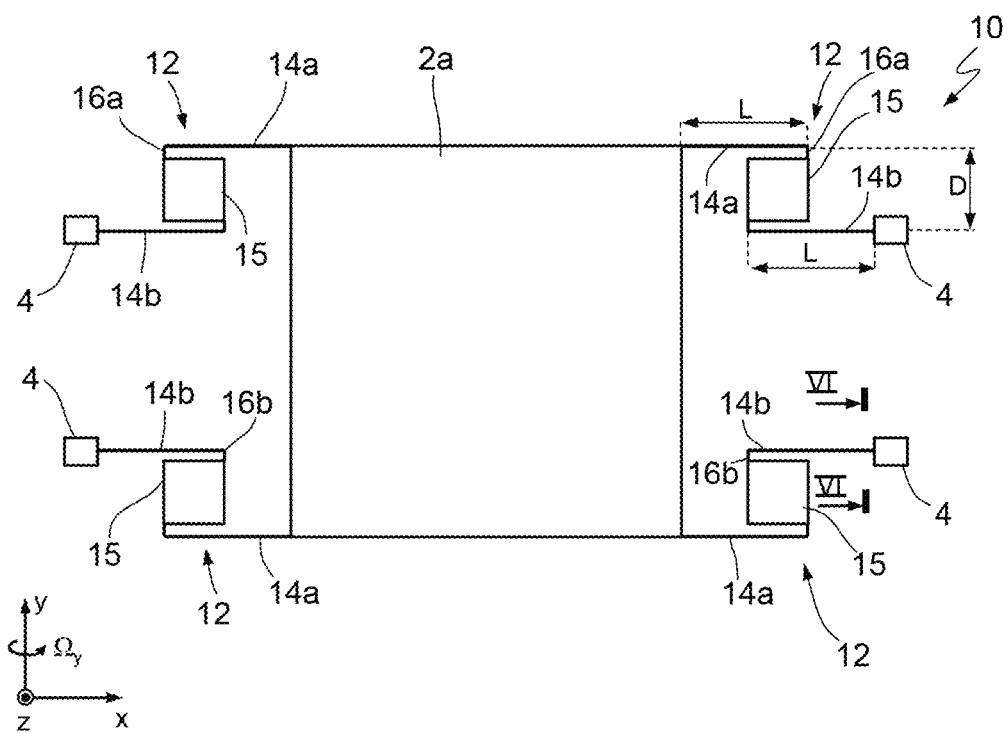
FIG. 5 shows a top view, schematic and simplified, of a microelectromechanical measurement structure of a MEMS gyroscope according to one aspect of the present solution.

In the example in FIG. 5, the mobile mass 2a is again coupled to four anchor points 4, disposed externally to this mobile mass 2a, by means of respective suspension elements 12, which extend from a respective corner or apex of the mobile mass 2a to a corresponding anchor point 4.

Figure 6:
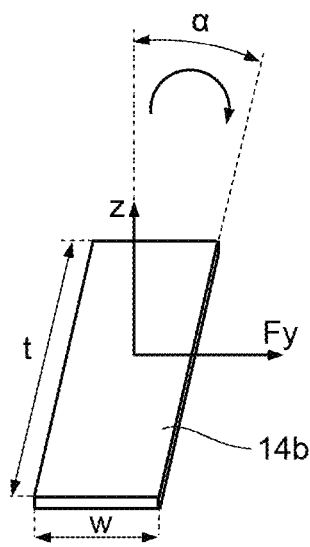
FIG. 6 shows, as an enlargement, a transverse cross-section of an elastic element of the measurement structure in FIG. 5.

As shown schematically in FIG. 6, and as previously discussed, the wall angle $\alpha$ comprises a distortion in the transverse cross-section, in the plane yz, of the elastic elements 14a, 14b of the suspension elements 12, in the presence, in this case, of a bending force $F_y$ acting along the second horizontal axis y, due to the actuating movement.

In the presence of the actuating movement of the mobile mass 2a, a skew bending of these elastic elements 14a, 14b out of the horizontal xy plane therefore occurs, along the vertical axis z.

Figure 7A:
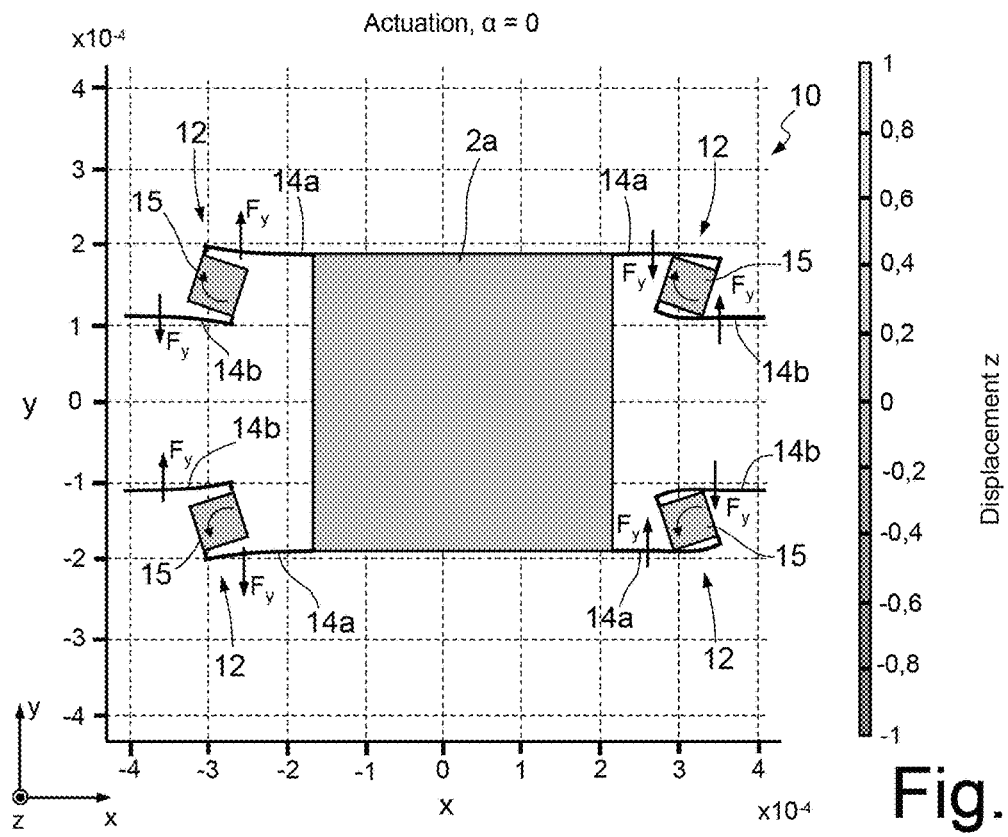
FIGS. 7A-7B show the measurement structure in FIG. 5, in an actuating movement in the absence or in the presence of a quadrature error, respectively.

In particular, FIG. 7A shows schematically, in an ideal case (in other words, in which the effect of the wall angle $\alpha$ is not considered), the actuating movement of the mobile mass 2a along the first horizontal axis x and the consequent bending of the elastic elements 14a, 14b of the suspension elements 12, originating from the respective bending forces $F_y$ acting along the second horizontal axis y (in the directions indicated by the arrows in this FIG. 7A). The bending of the elastic elements 14a, 14b comprises a rotation in the horizontal xy plane of the rigid bodies 15 of these suspension elements 12, about the vertical axis z (again as indicated by the arrows in FIG. 7A).

Figure 7B:
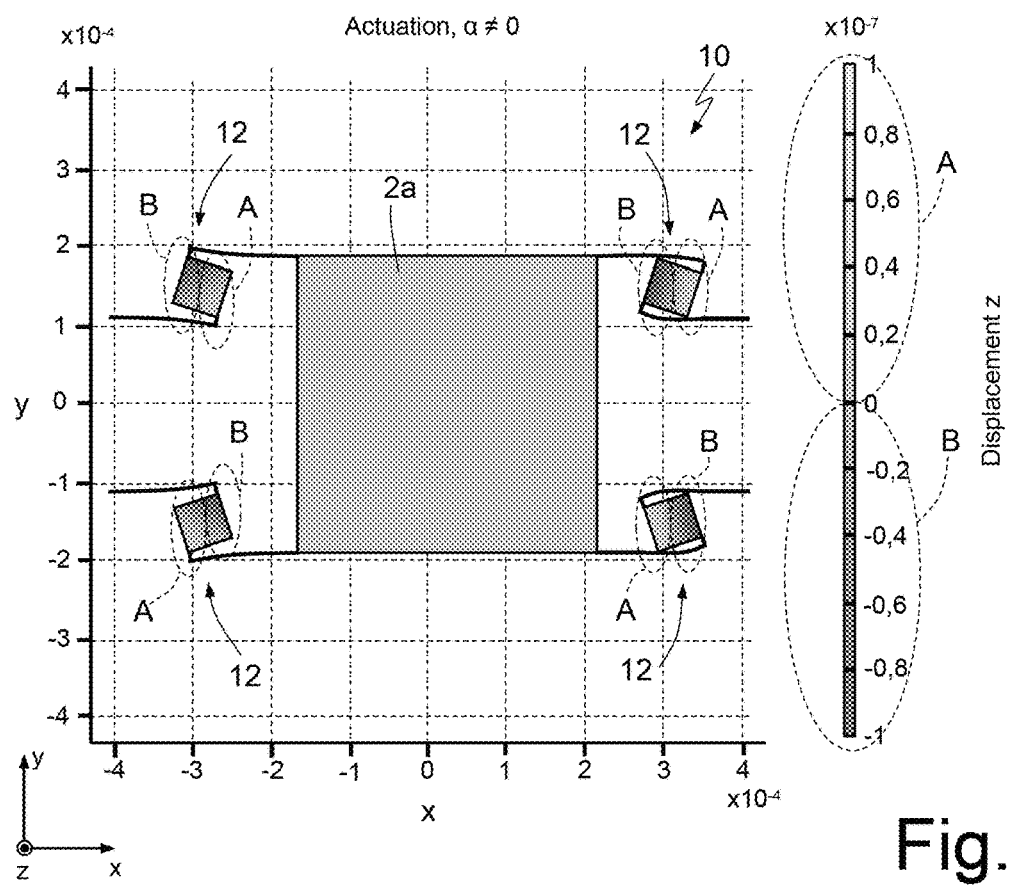

As shown schematically in FIG. 7B, through the effect of the wall angle $\alpha$, in the presence of the aforementioned bending forces $F_y$ due to the actuating movement, the elastic elements 14a, 14b undergo a deformation by skew bending out of the horizontal xy plane.

However, as indicated in this FIG. 7B, the elastic elements 14a, 14b of a same suspension element 12 undergo deformations in opposite directions relative to the vertical axis z and, consequently, opposing displacements out of the horizontal xy plane. The related rigid body 15, connected to the elastic elements 14a, 14b therefore has a first half, indicated with A in FIG. 7B, which undergoes a displacement towards a first direction of the vertical axis z (in the example upwards), and a second half, indicated with B, which undergoes a corresponding displacement in a second direction of the vertical axis z (in the example downwards).

Overall, the rigid body 15 thus absorbs all the unwanted displacement along the vertical axis z, due to the effect of the wall angle, in such a manner that the mobile mass 2a remains in the horizontal xy plane, without undergoing any substantial displacement along this vertical axis z.

In other words, the suspension elements 12 internally compensate the unwanted displacements out of the horizontal xy plane, due to the effect of the wall angle (in this case, considered with respect to the second horizontal axis y, relative to which the bending of the elastic elements 14a, 14b takes place).

It should furthermore be noted that the wall angle relative to the first horizontal axis x has, in this case, an effect that is substantially negligible, given that these elastic elements 14a, 14b do not have a significant component of deformation along this first horizontal axis x during the actuation movement.

In a manner not shown, the suspension elements 12 do not furthermore oppose the measurement movement of the mobile mass 2a, due to the Coriolis force which is generated in the presence of the angular velocity $\Omega_y$, acting about the second horizontal axis y. In this case, therefore, the mobile mass 2a is free to move along the vertical axis z, getting closer to or further away from a facing measurement electrode (not shown) to vary the related capacitive coupling. In other words, the suspension elements 12 do not prevent the measurement movement of the mobile mass for the measurement of the angular velocity $\Omega_y$.

Figure 8:
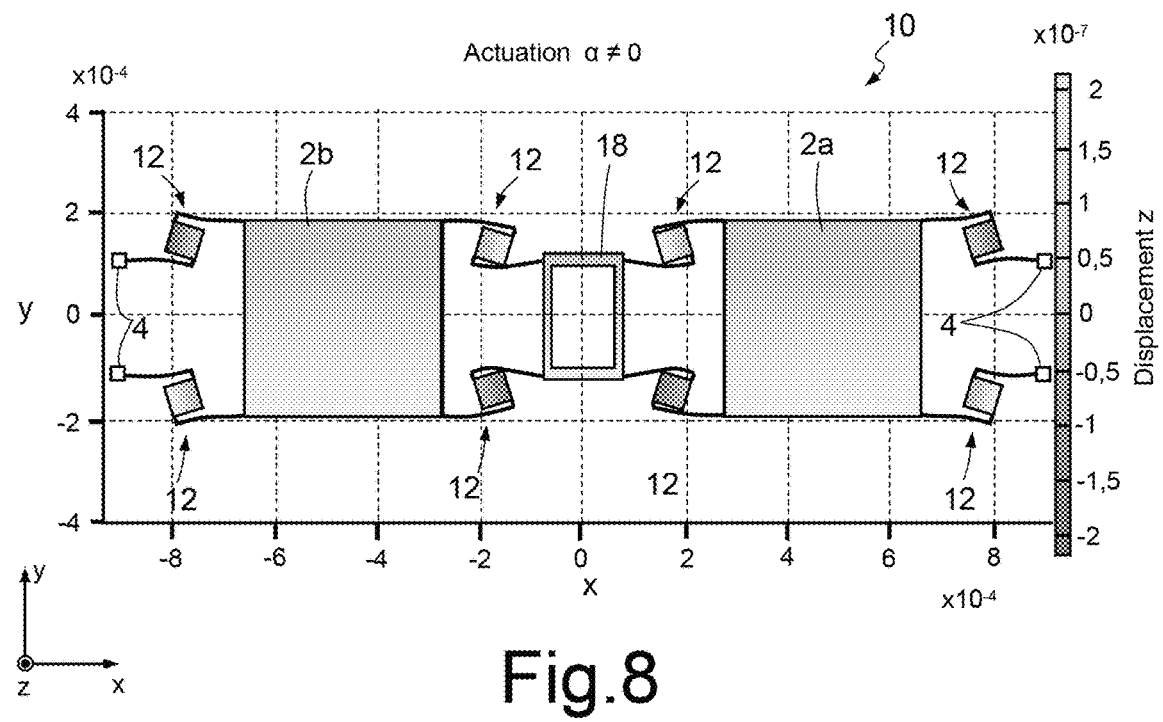
FIG. 8 shows a top view, schematic and simplified, of a microelectromechanical measurement structure of a MEMS gyroscope according to a further aspect of the present solution.

As illustrated schematically in FIG. 8, the MEMS gyroscope 10, again uniaxial, may be of the differential type comprising, in this case, a second mobile mass 2b coupled to the, in this case defined as first, mobile mass 2a by means of a central coupling body 18 (formed in a manner known per se, here not discussed in detail and coupled to the substrate 5).

The second mobile mass 2b, just as the first mobile mass 2a, is suspended from the top of the substrate 5 (FIG. 1) by means of respective suspension elements 12, implemented and operated in a manner completely similar to what was previously discussed, in order to internally compensate the deformations out of the horizontal xy plane and the resulting quadrature error.

In particular, in this case, for each mobile mass 2a, 2b, the two suspension elements 12 furthest from the central coupling body 18 (along the first horizontal axis x) are connected to respective anchor points 4, whereas the two suspension elements 12 closest to the same central coupling body 18 (again along the first horizontal axis x) are connected to the aforementioned central coupling body 18 and, via this, to the substrate 5 (FIG. 1).

In a known manner, a symmetrical measurement structure, in other words comprising a pair of mobile masses for each measurement axis about which it is possible to measure a rotation at a corresponding angular velocity, enables the rejection, by means of the employment of suitable differential read circuits, of interfering linear accelerations which are applied externally, for example caused by impacts acting on the sensor or by the acceleration due to gravity. In fact, whereas the Coriolis force tends to unbalance the mobile masses of each pair in opposing directions and substantially by the same amount (generating "out-of-phase" movements), interfering external accelerations produce displacements of these in the same direction and again by the same amount (generating "in-phase" movements); by performing the difference in the electrical signals associated with the two mobile masses, it is ideally possible to measure the contribution solely due to the Coriolis force and to reject the contributions from the interfering accelerations.

Another aspect of the present solution provides the implementation, in a suitable manner, of a mechanical coupling of the elastic type between at least one mobile mass, designed to move along a first actuation direction since actuated in an appropriate manner, and at least one different mobile mass, designed to move in a manner driven along a second actuation direction, transverse to the first actuation direction, in such a manner that these first and second actuating masses move in a mutually synchronized fashion and with an established phase.

As will be described in detail in the following, the presence of at least two actuating masses, which move relative to each other along two mutually transverse actuating directions, can allow the measurement of angular velocities about three axes of a Cartesian reference system (rigidly attached to the MEMS gyroscope). The presence of elastic coupling elements between the actuating mobile masses allows a single actuating movement to be used for moving all the mobile masses of the microelectromechanical structure, and therefore a single feedback control loop to be implemented for the control of the actuating movement.

Figure 9:
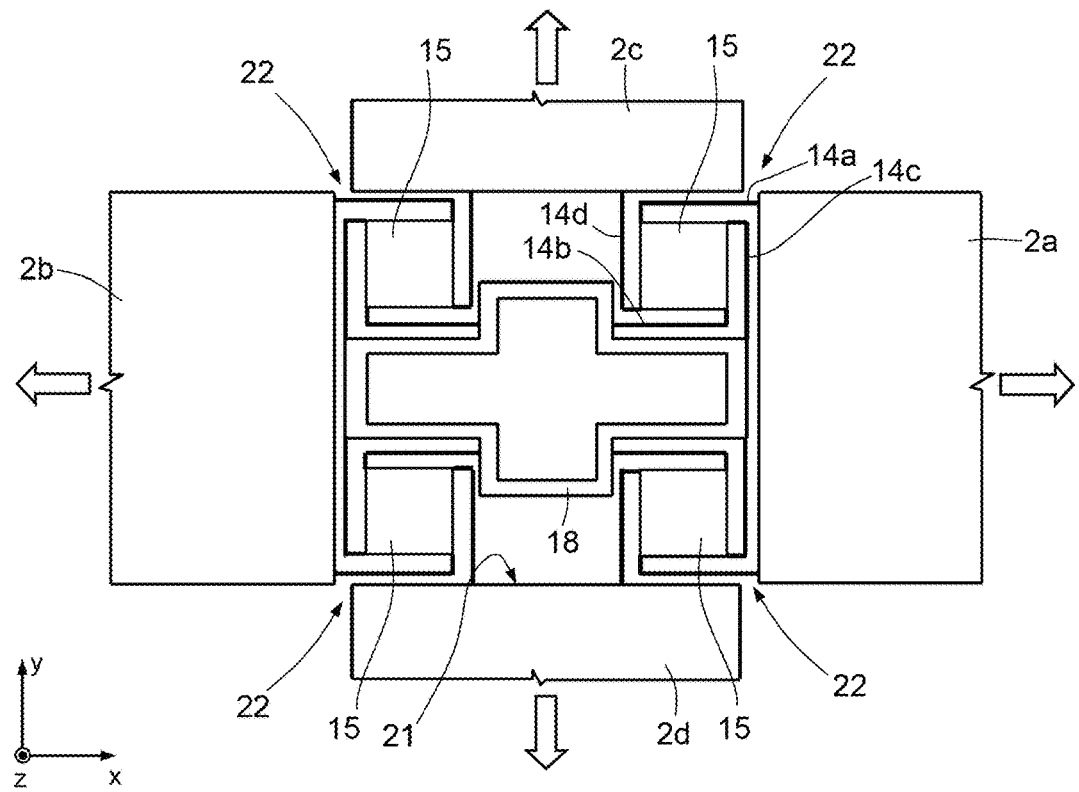
FIG. 9 shows a top view, schematic and simplified, of a portion of a microelectromechanical measurement structure of a MEMS gyroscope according to yet another aspect of the present solution.

Reference is now made to the schematic representation shown in FIG. 9, in which, for the sake of presentation clarity, only a central portion of the MEMS gyroscope 10 is shown.

The MEMS gyroscope 10 comprises, in this case, a first pair of mobile masses, in particular a first and a second mobile mass 2a and 2b, able to be actuated (in a manner similar to that previously discussed, for example by a group of actuating interdigitated electrodes) along a first actuation direction, in the example along the first horizontal axis x; and a second pair of mobile masses, in particular a third and a fourth mobile mass 2c and 2d, able to be driven by the first actuating movement into a respective second actuating movement along a second actuation direction, in the example along the second horizontal axis y, as indicated by the arrows in this FIG. 9.

The mobile masses 2a and 2b of the first pair are aligned along the first horizontal axis x, and the mobile masses 2c, 2d of the second pair are aligned along the second horizontal axis y.

The mobile masses 2a-2d are furthermore disposed reciprocally in such a manner as to define a central window (or opening) 21, within which the central coupling body 18 is placed.

In a manner not shown here, the mobile masses 2a-2d may advantageously be elastically suspended from the top of the substrate 5 (FIG. 1) by means of respective suspension elements 12, formed in a manner completely similar to that previously discussed.

The MEMS gyroscope 10 furthermore comprises the aforementioned central coupling body 18, to which the mobile masses 2a-2d are elastically coupled by means of coupling elements 22, of the elastic type, which are furthermore configured for the transmission of the actuating movement of the mobile masses 2a, 2b of the first pair to the mobile masses 2c, 2d of the second pair.

Each coupling element 22 is formed in a manner substantially similar to the suspension elements 12 previously described in detail, with the difference of having another pair of elastic elements disposed in a direction perpendicular to the first.

Each coupling element 22 therefore comprises, in addition to the rigid body 15 and to the first and to the second elastic element 14a, 14b, having a linear extension along the actuation direction (in the example along the first horizontal axis x), a third and a fourth elastic element 14c, 14d, having a linear extension along the second horizontal axis y (in other words, along the direction of the driven movement of the mobile masses 2c, 2d of the second pair).

The elastic elements 14a-14d extend out from a respective corner or apex of the rigid body 15. In particular, the first and the second elastic element 14a, 14b elastically connect a respective mobile mass 2a-2b of the first pair to the central coupling body 18, whereas the third and the fourth elastic element 14c, 14d elastically connect a respective mobile mass 2c-2d of the second pair to the same central coupling body 18, in such a manner as to carry out the transmission of the actuating movement from the aforementioned mobile mass of the first pair to the aforementioned mobile mass of the second pair.

Figure 10A:
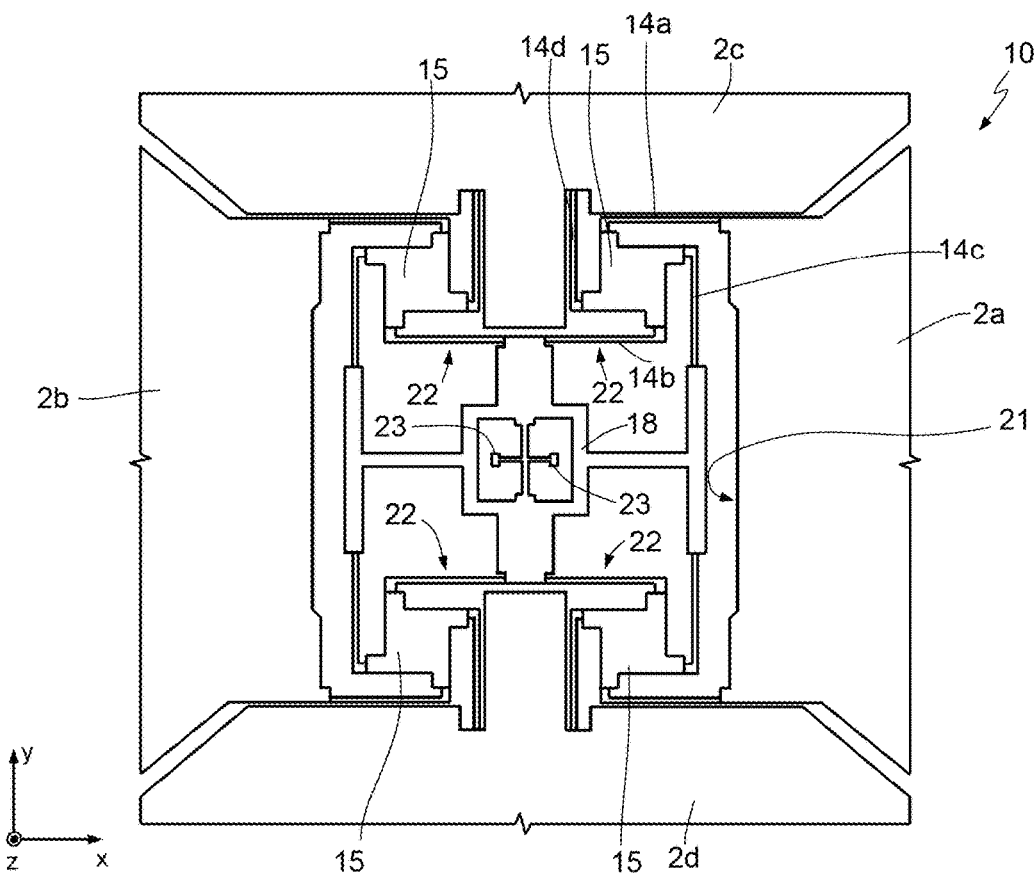
FIG. 10A shows a top view of one possible implementation of the measurement structure shown schematically in FIG. 9.

FIG. 10A shows a possible embodiment of the MEMS gyroscope 10 in FIG. 9, which implements the coupling structure and elastic transmission of the actuating movement previously described.

This FIG. 10A also shows the elastic coupling of the central coupling body 18 to the substrate 5 (FIG. 1), via respective anchor points 23.

Figure 10B:
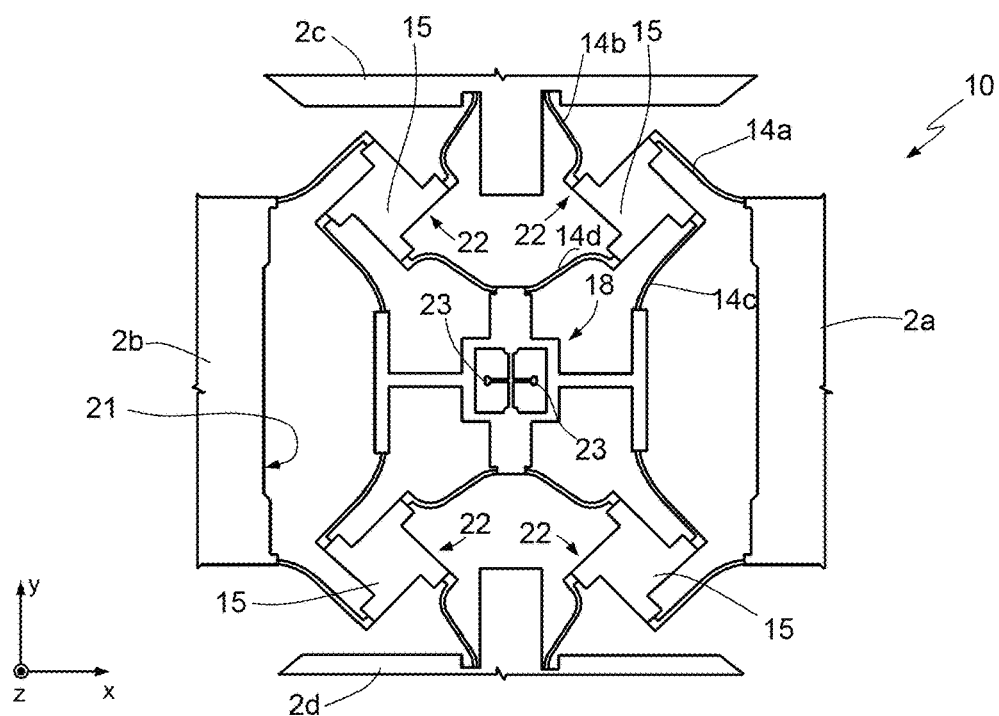
FIG. 10B shows a detail of the measurement structure in FIG. 10A in the presence of an actuating movement.

As shown in FIG. 10B, in the presence of the actuating movement along the first horizontal axis x of the mobile masses 2a-2b of the first pair, the elastic elements 14a-14d of the coupling elements 22 are deformed by bending, causing the rotation of the respective rigid bodies 15 about the vertical axis passing through the respective center (referred to as a "wheel" movement), and in this way transmitting the actuating movement from the mobile masses 2a-2b of the first pair to the mobile masses 2c-2d of the second pair.

During this actuating movement, in a manner substantially similar to that previously discussed for the suspension elements 12, the coupling elements 22 internally compensate the unwanted displacements out of the horizontal xy plane, due to the effect of the wall angle on the elastic elements 14a-14d.

In fact, just like the first and the second elastic element 14a, 14b, the third and the fourth elastic element 14c, 14d also undergo deformations in opposing directions relative to the vertical axis z and, consequently, opposing displacements out of the horizontal xy plane.

Therefore, the relevant rigid bodies 15 absorb all the unwanted displacement along the vertical axis z, due to the effect of the wall angle on the elastic elements 14a-14d, such that the mobile masses 2a-2d remain in the horizontal xy plane, without substantially undergoing any displacement along the vertical axis z during the actuating movement.

The coupling solution described may therefore advantageously be used for the fabrication of a MEMS gyroscope, of the two-axis or three-axis type.

Figure 11:
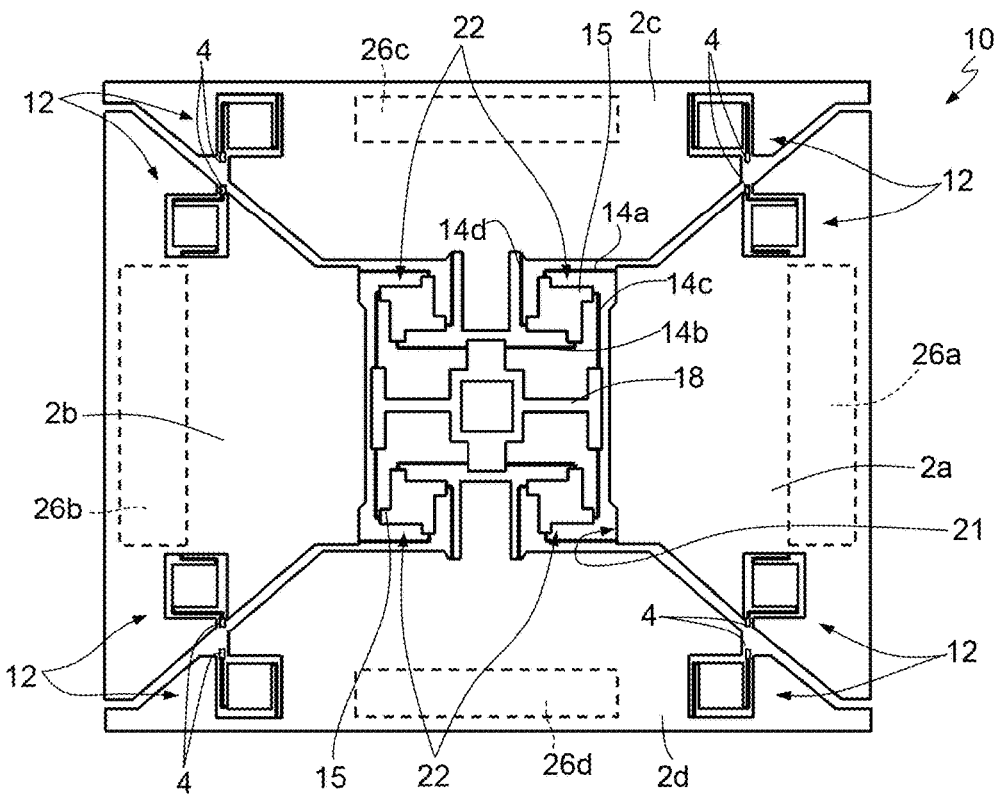
FIG. 11 shows a top view of a microelectromechanical measurement structure of a MEMS gyroscope, of the three-axis type, according to a further embodiment of the present solution.
Figure 11:
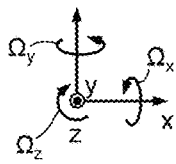

In this regard, FIG. 11 shows schematically the measurement structure of a MEMS gyroscope 10, of the two- or three-axis type, comprising: the coupling elements 22, for the elastic coupling between the mobile masses 2a-2d; and the suspension elements 12, for the elastic coupling of these mobile masses 2a-2d with anchor points 4 rigidly fixed to the substrate 5 (FIG. 1).

In particular, each mobile mass 2a-2d is, in this case, elastically connected to a pair of coupling elements 22, with corresponding respective end portions facing the central window 21, and to a pair of suspension elements 12, with corresponding respective end portions disposed externally (or remotely) relative to this central window 21 along the first horizontal axis x.

In the embodiment illustrated in FIG. 11, the coupling elements 22 are disposed inside of the central window 21, whereas the suspension elements 12 are disposed inside of the respective mobile masses 2a-2d, with the aforementioned corresponding end portions placed at a distance from this central window 21.

In FIG. 11, measurement electrodes 26a-26b are furthermore shown, each disposed underneath a respective mobile mass 2a-2b, for the measurement, by means of capacitive coupling, of a related measurement movement along the vertical axis z in response to an angular velocity $\Omega_y$ about the second horizontal axis y ("roll" velocity), or to an angular velocity 1 about the first horizontal axis x ("pitch" velocity).

In this FIG. 11, the electrodes of the actuation group are not illustrated, which electrodes are designed to actuate the mobile masses 2a-2b of the first pair, which may be disposed, in a known manner, externally to these mobile masses 2a-2b, or else inside of appropriate windows formed in these mobile masses 2a-2b; and the other measurement electrodes are furthermore not illustrated, which may be provided for example inside of suitable windows formed in the mobile masses 2c-2d of the second pair, for the measurement of a related measurement movement along the first horizontal axis x in response to an angular velocity $\Omega_z$ about the vertical axis z ("yaw" velocity), in the case of a three-axis implementation of the MEMS gyroscope 10.

In any case, the solution described does not provide, either for the elastic suspension of the mobile masses 2a-2d or for the coupling between these mobile masses 2a-2d and the transmission of the actuating movement, the presence of elastic elements of the folded type, or of conventional elastic elements which, subjected to the effects of the wall angle, can transmit a non-zero resultant force in the vertical direction onto these mobile masses 2a-2d.

The advantages of the solution provided are clearly apparent from the preceding description.

In any case, it is again highlighted that the solution described allows a simple compensation of the mechanical type to be obtained for the effect of the quadrature error due to the unwanted coupling of the actuation and measurement movements.

Such a solution does not include an increase in the occupation of surface area of the microelectromechanical structure of the MEMS gyroscope, let alone use resources dedicated to the compensation in the interface ASIC electronic circuit of this MEMS gyroscope.

In particular, the use of the suspension elements 12 allows the displacements out of the horizontal xy plane of the elastic elements 14a-14d caused by the wall angle to be internally compensated. Furthermore, the use of the coupling elements 22 allows the transmission of the actuating movement to be implemented between the actuated mobile masses 2a-2b and the driven mobile masses 2c-2d, advantageously reducing the propagation of the quadrature error.

Test and simulations carried out by the applicant have demonstrated the possibility of further reducing by a third the effects of the quadrature error with respect to known solutions, by considering corresponding design constraints, in particular as regards the occupation of surface area.

The micromechanical structure described is extremely compact, allowing the fabrication of a three-axis MEMS gyroscope using integrated technology, in which the space required is reduced to a minimum and which exhibits improved electrical performance characteristics.

Figure 12:
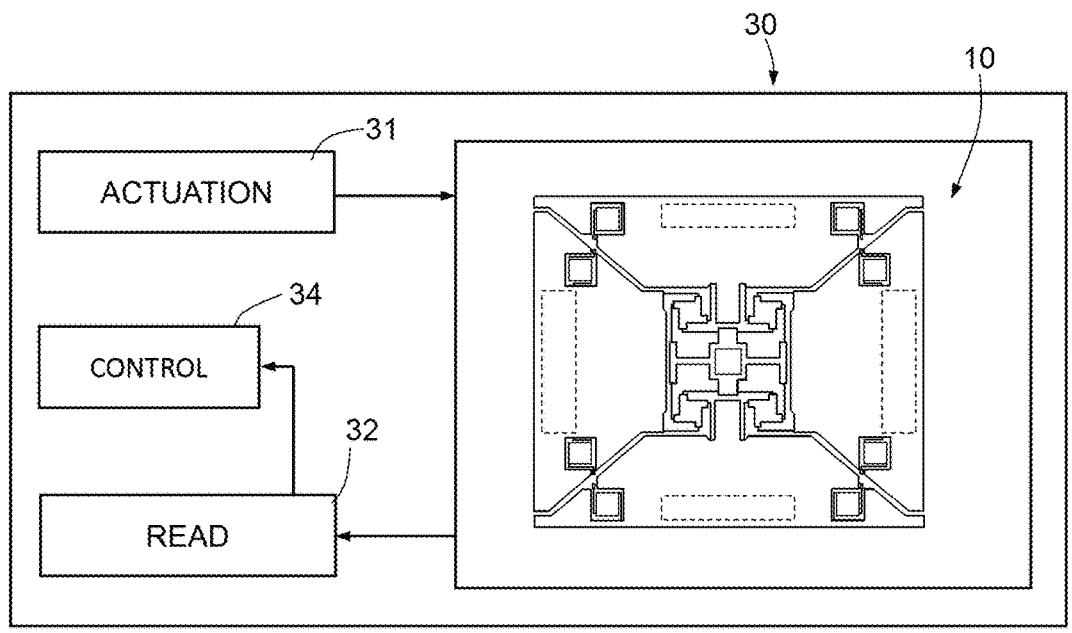
FIG. 12 is an outline block circuit diagram of an electronic device incorporating the MEMS gyroscope of FIG. 11 according to a further aspect of the present solution.

In essence, the aforementioned features make the MEMS gyroscope 10 particularly appropriate for integration into an electronic device 30, as shown in FIG. 12, usable in a plurality of electronic systems, for example in inertial navigation systems, in automotive systems or in systems of the portable type, such as for example: a PDA (Personal Digital Assistant); a portable computer; a cellular mobile telephone; a digital audio reproduction device; a photo- or videocamera; the electronic device 30 being generally capable of processing, storing, transmitting and receiving signals and information.

The electronic device 30 comprises an actuation circuit 31, configured for imparting the actuating movement to the mobile masses 2a-2d, and for supplying biasing signals to the microelectromechanical structures (in a manner known per se, not shown in detail here); a read circuit 32, operationally coupled to measurement capacitors associated with these mobile masses 2a-2d, in order to measure the extent of the displacements of these mobile masses 2a-2d and, thus to determine the angular velocities acting on the structure; and an electronic control unit 34, for example a microprocessor, microcontroller or similar processing device, connected to the read circuit 32, and designed to supervise the general operation of the electronic device 30, for example on the basis of the measured and determined angular velocities.

Finally, it is clear that modifications and variants may be applied to what is described and illustrated without however straying from the scope of protection of the present disclosure.

In particular, variants may be provided for the implementation of the elastic suspension and coupling elements 12, 22 between the mobile masses 2a-2d. For example, a different position in the horizontal xy plane and/or a different geometry and/or a different implementation of the rigid body 15 could be provided, also depending on the length L of the elastic elements 14a-14b and on their mutual separation D.

Furthermore, in a known manner, the displacement of the mobile masses 2a-2d may be determined with α technique different from the capacitive method, for example by means of the measurement of a magnetic force; and the actuating movement may be generated in a different manner, for example by means of parallel-plate electrodes, or else by means of magnetic actuation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS gyroscope, comprising:
a substrate;
at least one first mobile mass suspended from a top surface of the substrate;
a plurality of anchor points rigidly fixed to the top surface of the substrate; and
a plurality of elastic suspension elements, each of the elastic suspension elements including:
a rigid body having a first portion proximal to the at least one first mobile mass and a second portion proximal to a respective one of the anchor points, the second portion opposite the first portion; and
a pair of elastic elements, a first elastic element of the pair of elastic elements having a first end connected to the at least one first mobile mass and a second end connected to the second portion of the rigid body, a second elastic element of the pair of elastic elements having a first end connected to the respective one of the anchor points and a second end connected to the first portion of the rigid body,
wherein the at least one first mobile mass is configured to be actuated in an actuating movement along a first axis of a horizontal plane parallel to the top surface and configured to move in a measurement movement along a vertical axis transverse to said horizontal plane in response to a first angular velocity acting about a second axis of said horizontal plane transverse to said first axis, said elastic suspension elements configured to compensate unwanted displacements of the at least one mobile mass out of the horizontal plane along the vertical axis originating from said actuating movement.

2. The gyroscope according to claim 1 wherein each of the pair of elastic elements are of the linear type having a main extension along said first axis, and the pair of elastic elements are configured to undergo, during said actuating movement, deformations in opposing directions out of said horizontal plane along said vertical axis.

3. The gyroscope according to claim 2 wherein the rigid body of each of the elastic suspension elements is configured to absorb said unwanted displacements out of the horizontal plane along the vertical axis.

4. The gyroscope according to claim 1 wherein said first and second portions of said rigid body are mutually opposing along a diagonal of said rigid body in a cross-section parallel to said horizontal plane, and wherein said first and second elastic elements are parallel to each other and placed at a separation distance along said second axis, said rigid body being interposed between said first and second elastic elements along said second axis in a central position.

5. The gyroscope according to claim 1 wherein said first mobile mass has a substantially rectangular design in a cross-section parallel to said horizontal plane and said elastic suspension elements extend from respective apices of said mobile mass.

6. The gyroscope according to claim 1, further comprising:
a second mobile mass configured to form, with said first mobile mass, a first differential measurement pair for a measurement of said first angular velocity acting about said second axis of said horizontal plane, said first and second mobile masses being aligned along said first axis;
a third mobile mass and a fourth mobile mass configured to form a second differential measurement pair for a measurement of a second angular velocity acting about said first axis of said horizontal plane, said third and fourth mobile mass being aligned along said second axis; and
elastic coupling elements configured to couple the actuating movement of said first and second mobile masses along said first axis to a driven movement of said third and fourth mobile mass along said second axis, wherein said elastic coupling elements are configured to compensate unwanted displacements out of the horizontal plane along the vertical axis originating from said actuating movement.

7. The gyroscope according to claim 6 wherein each of said elastic coupling elements comprises:
a first pair of elastic elements of the linear type having a main extension along said first axis and configured to undergo, during said actuating movement, deformations in opposite directions out of said horizontal plane along said vertical axis; and
a second pair of elastic elements of the linear type having a main extension along said second axis and configured to undergo, during said driven movement, deformations in opposite directions out of said horizontal plane along said vertical axis.

8. The gyroscope according to claim 7 wherein each of said elastic coupling elements comprises a respective rigid body coupled to said elastic elements of said first and second pair of elastic elements, the rigid body and elastic coupling elements configured to absorb said unwanted displacements out of the horizontal plane along the vertical axis.

9. The gyroscope according to claim 8 further comprising:
a first elastic element of said first pair of elastic elements that connects a first end portion of said respective rigid body to a respective mobile mass of said first differential measurement pair;
a second elastic element of said first pair of elastic elements that connects a second end portion of said respective rigid body to a central coupling body;

a third elastic element of said second pair of elastic elements that connects a third end portion of said respective rigid body to said central coupling body; and a fourth elastic element of said second pair of elastic elements that connects a fourth end portion of said respective rigid body to a respective mobile mass of said second differential measurement pair.

10. The gyroscope according to claim 9 wherein said first and second end portions of said respective rigid body are mutually opposing along a first diagonal of said respective rigid body in a cross-section parallel to said horizontal plane; and said third and fourth end portions of said respective rigid body are mutually opposing along a second diagonal of said respective rigid body in the cross-section parallel to said horizontal plane.

11. The gyroscope according to claim 9 wherein each rigid body is configured to rotate about said vertical axis subsequent to said actuating and driven movements.

12. The gyroscope according to claim 11 wherein said mobile masses of said first and second differential measurement pairs define a central window within which said central coupling body and said elastic coupling elements are disposed, each of said mobile masses of said first and second differential measurement pair being coupled to respective elastic suspension elements coupled a respective anchor points rigidly fixed to said substrate, said elastic suspension elements being disposed at a distance from said central window.

13. The gyroscope according to claim 6 wherein said mobile masses of said second differential measurement pair are further configured to move in a further measurement movement along said first axis in response to a third angular velocity about said vertical axis.

14. The gyroscope according to claim 6 wherein said elastic suspension elements and said elastic coupling elements are configured to enable the measurement movement out of the horizontal plane of said mobile masses of said first and second differential measurement pair for the measurement of said first and second angular velocity.

15. An electronic device, comprising:
a MEMS gyroscope including a first mobile mass coupled to anchor points of a substrate through elastic suspension elements, the first mobile mass configured to be actuated in an actuating movement along a first axis of a horizontal plane parallel to a surface of the substrate and configured to move in a measurement movement along a vertical axis orthogonal to the horizontal plane in response to a first angular velocity about a second axis of the horizontal plane orthogonal to the first axis, the elastic suspension elements configured to generate opposing displacements along the vertical axis in response to the actuating movement to maintain the first mobile mass in the horizontal plane in the presence of the actuating movement, each of the elastic suspension elements including:
a rigid body having a first portion proximal to the first mobile mass and a second portion proximal to a respective one of the anchor points, the second portion opposite the first portion; and
a pair of elastic elements, a first elastic element of the pair of elastic elements having a first end connected to the first mobile mass and a second end connected to the second portion of the rigid body, a second elastic element of the pair of elastic elements having a first end connected to the respective one of the anchor points and a second end connected to the first portion of the rigid body;
an actuation stage coupled to said MEMS gyroscope and configured to actuate said first actuation mass in said actuating movement; and
a read stage coupled to said MEMS gyroscope and configured to measure an extent of displacements of the first mobile mass in said measurement movement.

16. The MEMS gyroscope of claim 15, further comprising an inertial navigation system.

17. The MEMS gyroscope of claim 15, further comprising a second mobile mass, third mobile mass, and fourth mobile mass, the first and second mobile masses configured to form a first differential measurement pair and the third and fourth mobile masses configured to form a second differential measurement pair.

18. A method, comprising:
actuating a first mobile mass to move in an actuating movement along a first axis of a horizontal plane parallel to a surface of a substrate, the first mobile mass being coupled through elastic elements to the substrate, each of the elastic elements including:
a rigid body having a first portion proximal to the first mobile mass and a second portion proximal to a respective one of a plurality of anchor points rigidly fixed to the surface of the substrate, the second portion opposite the first portion; and
a pair of elastic elements, a first elastic element of the pair of elastic elements having a first end connected to the first mobile mass and a second end connected to the second portion of the rigid body, a second elastic element of the pair of elastic elements having a first end connected to the respective one of the anchor points and a second end connected to the first portion of the rigid body;
displacing the first mobile mass in a measurement movement along a vertical axis orthogonal to the horizontal plane in response to a first angular velocity about a second axis of the horizontal plane orthogonal to the first axis; and
generating opposing displacements of the elastic elements along the vertical axis in response to the actuating movement.

19. The method of claim 18 wherein generating opposing displacements of the elastic elements along the vertical axis in response to the actuating movement comprises rotating a rigid body about the vertical axis in response to the actuating movement to generate the opposing displacements of the elastic elements.

20. The gyroscope according to claim 1 wherein a length of the first elastic element of the pair of elastic elements is substantially the same as a length of the second elastic element of the pair of elastic elements.

* * * * *